US011923192B2

(12) United States Patent
Tang et al.

(10) Patent No.: US 11,923,192 B2
(45) Date of Patent: Mar. 5, 2024

(54) METHODS FOR DEPOSITING AN OXIDE FILM ON A SUBSTRATE BY A CYCLICAL DEPOSITION PROCESS AND RELATED DEVICE STRUCTURES

(71) Applicant: ASM IP Holding B.V., Almere (NL)

(72) Inventors: Fu Tang, Gilbert, AZ (US); Delphine Longrie, Ghent (BE); Peng-Fu Hsu, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/943,336

(22) Filed: Sep. 13, 2022

(65) Prior Publication Data

US 2023/0015724 A1    Jan. 19, 2023

Related U.S. Application Data

(62) Division of application No. 16/397,045, filed on Apr. 29, 2019, now Pat. No. 11,469,098.

(60) Provisional application No. 62/668,679, filed on May 8, 2018.

(51) Int. Cl.
*H01L 21/02* (2006.01)
*C23C 16/40* (2006.01)
*C23C 16/455* (2006.01)

(52) U.S. Cl.
CPC ........ *H01L 21/0228* (2013.01); *C23C 16/401* (2013.01); *C23C 16/45553* (2013.01); *H01L 21/02164* (2013.01); *H01L 21/02178* (2013.01); *H01L 21/022* (2013.01); *H01L 21/02205* (2013.01); *H01L 21/02211* (2013.01); *H01L 21/02181* (2013.01); *H01L 21/02183* (2013.01); *H01L 21/02186* (2013.01); *H01L 21/02189* (2013.01); *H01L 21/02192* (2013.01)

(58) Field of Classification Search
CPC .................................... H01L 21/0228
See application file for complete search history.

(56) References Cited

U.S. PATENT DOCUMENTS

| | | | |
|---|---|---|---|
| 6,723,642 B1 | 4/2004 | Lim et al. |
| 7,402,534 B2 | 7/2008 | Mahajani |
| 2001/0024387 A1 | 9/2001 | Raaijmakers et al. |
| 2005/0112282 A1 | 5/2005 | Gordon et al. |
| 2005/0282350 A1 | 12/2005 | Chou et al. |
| 2006/0223337 A1 | 10/2006 | Ahn et al. |
| 2007/0048953 A1 | 3/2007 | Gealy et al. |
| 2007/0065578 A1 | 3/2007 | McDougall |
| 2010/0015797 A1 | 1/2010 | Saito et al. |
| 2010/0055926 A1 | 3/2010 | Ohashi et al. |

*Primary Examiner* — John A Bodnar
(74) *Attorney, Agent, or Firm* — Snell & Wilmer L.L.P.

(57) ABSTRACT

A method for depositing an oxide film on a substrate by a cyclical deposition is disclosed. The method may include: depositing a metal oxide film over the substrate utilizing at least one deposition cycle of a first sub-cycle of the cyclical deposition process; and depositing a silicon oxide film directly on the metal oxide film utilizing at least one deposition cycle of a second sub-cycle of the cyclical deposition process. Semiconductor device structures including an oxide film deposited by the methods of the disclosure are also disclosed.

20 Claims, 11 Drawing Sheets

METHODS FOR DEPOSITING AN OXIDE FILM ON A SUBSTRATE BY A CYCLICAL DEPOSITION PROCESS AND RELATED DEVICE STRUCTURES

CROSS-REFERENCE TO RELATED APPLICATION

This application is a Divisional of, and claims priority to and the benefit of, U.S. patent application Ser. No. 16/397,045, filed Apr. 29, 2019 and entitled "METHODS FOR DEPOSITING AN OXIDE FILM ON A SUBSTRATE BY A CYCLICAL DEPOSITION PROCESS AND RELATED DEVICE STRUCTURES," which is a Non-Provisional of, and claims priority to and the benefit of, U.S. Ser. No. 62/668,679, filed May 8, 2018 and entitled "METHODS FOR DEPOSITING AN OXIDE FILM ON A SUBSTRATE BY A CYCLICAL DEPOSITION PROCESS AND RELATED DEVICE STRUCTURES," which are hereby incorporated by reference herein.

FIELD OF INVENTION

The present disclosure relates generally to methods for depositing an oxide film by a cyclical deposition process and particular methods for depositing an oxide film by a cyclical deposition process including a first sub-cycle and a second sub-cycle. The present disclosure is also related generally to semiconductor device structures comprising an oxide film deposited by a cyclical deposition process.

BACKGROUND OF THE DISCLOSURE

Silicon oxides, such as, for example, silicon dioxide ($SiO_2$), are one of the most widely utilized materials in the fabrication of semiconductor device structures. For example, silicon oxide films have been extensively employed as the gate oxide in complementary metal-oxide-semiconductor (CMOS) technology, as a liner material in shallow trench isolation (STI) structures, as a hardmask material in etching processes, as well as interface layers in a multitude of semiconductor device structures.

A silicon oxide film may commonly be deposited by a number of deposition methods, including, but not limited to, chemical vapor deposition (CVD), atomic layer deposition (ALD), and plasma-enhanced atomic layer deposition (PEALD). However, conventional deposition methods may not be ideal for next generation semiconductor device structures primarily due to the decreasing thermal budget frequently required for the fabrication of state of the art semiconductor device structures and the increasing requirement for highly conformal film deposition over substrates including high aspect ratio features. For example, to achieve deposition of a high quality silicon oxide film, the deposition process may necessarily include a very high deposition temperature, e.g., greater than approximately 800° C., for some CVD processes, or include a high density of plasma excited species, such as radicals and ions, e.g., as utilized in common plasma-enhanced atomic layer deposition (PEALD) processes. Accordingly, methods are desired for depositing an oxide film at a reduced deposition temperature and without plasma excitation of precursors.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some embodiments, methods of depositing an oxide film on a substrate by a cyclical deposition process are provided. The method may comprise: depositing a metal oxide film over a substrate utilizing at least one deposition cycle of a first sub-cycle of the cyclical deposition process; and depositing a silicon oxide film directly on the metal oxide film utilizing at least one deposition cycle of a second sub-cycle of the cyclical deposition process.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF EXEMPLARY EMBODIMENTS

Figure 1:
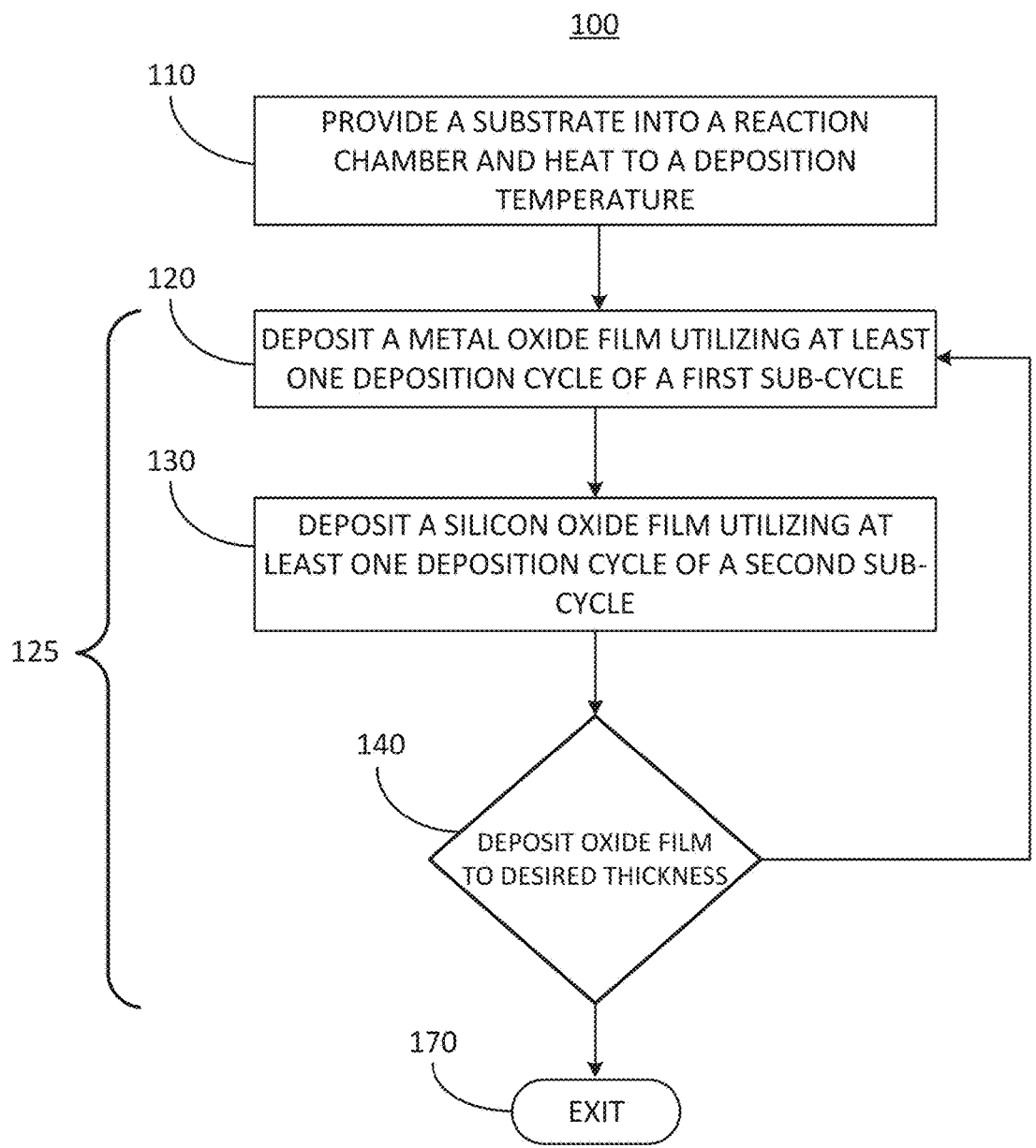
FIG. 1 illustrates a non-limiting exemplary process flow representing an overall cyclical deposition process according to the embodiments of the disclosure.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "cyclic deposition" may refer to the sequential introduction of precursors (reactants) into a reaction chamber to deposit a film over a substrate and includes deposition techniques such as atomic layer deposition and cyclical chemical vapor deposition.

As used herein, the term "cyclical chemical vapor deposition" may refer to any process wherein a substrate is sequentially exposed to two or more volatile precursors, which react and/or decompose on a substrate to produce a desired deposition.

As used herein, the term "substrate" may refer to any underlying material or materials that may be used, or upon which, a device, a circuit, or a film may be formed.

As used herein, the term "atomic layer deposition" (ALD) may refer to a vapor deposition process in which deposition cycles, preferably a plurality of consecutive deposition cycles, are conducted in a reaction chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition", "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "film" may refer to any continuous or non-continuous structures, material, or materials, deposited by the methods disclosed herein. For example, a "film" could include 2D materials, nanorods, nanotubes, nanolaminates, or nanoparticles or even partial or full molecular layers or partial or full atomic layers or clusters of atoms and/or molecules. A "film" may comprise material(s) or layer(s) with pinholes, but still be at least partially continuous.

As used herein, the term "oxide film" may refer to any film including an oxygen component and at least one additional component, including, but not limited to, a metal component and a silicon component.

As used herein, the term "sub-cycle" may refer to a cyclical deposition process comprising one or more unit cycles repeated for a predetermined number of times. A combination of 2 or more sub-cycles may make up an overall cyclical deposition process. This combination of two or more sub-cycles may be referred to as a cyclical deposition super-cycle.

A number of example materials are given throughout the embodiments of the current disclosure, it should be noted that the chemical formulas given for each of the example materials should not be construed as limiting and that the non-limiting example materials given should not be limited by a given example stoichiometry.

The present disclosure includes methods that may be employed for the deposition of an oxide film by a cyclical deposition process. The cyclical deposition process may comprise a cyclical deposition super-cycle comprising at least a first sub-cycle, utilized for the deposition of a metal oxide film, and a second sub-cycle, utilized for the deposition of a silicon oxide film. The oxide film may be deposited by repeating the cyclical deposition super-cycle one or more times such that one or more metal oxide films and one or more silicon oxide films are deposited on the substrate. The cyclical deposition processes disclosed herein may deposit an oxide film with superior characteristics to those deposited by previous cyclical deposition processes. In addition, the cyclical deposition processes disclosed herein may deposit an oxide film at a reduced deposition temperature and with excellent conformality over substrates including high aspect ratio features.

Thermal budgets in state of the art semiconductor device fabrication process have reduced to prevent the potential of thermal damage to device features, such as, for example, fin structures in FinFET semiconductor devices and channel materials in advanced CMOS devices. Due to such a reduction in the thermal budget of semiconductor device fabrication processes, high temperature deposition approaches, such as conventional high temperature CVD approaches may be utilized less frequently for the deposition of oxide films. One deposition approach that has gained significance in recent times for the deposition of oxide films is plasma-enhanced atomic layer deposition (PEALD). For example, PEALD processes may deposit an oxide film, e.g., a silicon oxide film, at a deposition temperature at or below 450° C. and such processes are commonly utilized for the formation of gate oxide materials, STI liner materials, and oxide interface layers.

However, as semiconductor feature sizes continue to decrease in advanced technology nodes, PEALD approaches may be undesirable for oxide film deposition for a number of reasons. Firstly, PEALD methods may deposit an oxide film over a substrate with high aspect ratio features with anisotropic film properties. For example, the high aspect ratio features on the substrate may comprise high aspect ratio trenches including sidewall portions and lateral portions and those portions of the oxide film disposed over sidewalls may have a lower quality compared with the oxide film disposed over the lateral portions of the trenches. The low quality of the oxide film disposed over the sidewall portions of the trenches may be due in part to the directionality of the excited plasma precursors in the PEALD processes. Secondly, the PEALD processes commonly utilize a plasma excited oxygen precursor for the formation of an oxide film. Plasma excitation of the oxygen precursor may generate high energy oxygen radicals which may penetrate into a semiconductor device structure to a significant thickness which may result in the unwanted oxidation of regions of the device, such as, for example, the channel region of a transistor device structure. Accordingly, methods are desirable for depositing an isotropic oxide film at reduced deposition temperature, i.e., below a substrate temperature of approximately 450° C., without utilizing plasma excitation of precursors, i.e., the deposition processes are carried in a plasma free environment.

Therefore, the embodiments of the disclosure may include methods for depositing an oxide film on a substrate by a cyclical deposition process. In some embodiments, the cyclical deposition process may comprise: depositing a metal oxide film over the substrate utilizing at least one deposition cycle of a first sub-cycle of the cyclical deposition process; and depositing a silicon oxide film directly on the metal oxide film utilizing at least one deposition cycle of a second sub-cycle of the cyclical deposition process.

A non-limiting example embodiment of a cyclical deposition process may include atomic layer deposition (ALD), wherein ALD is based on typically self-limiting reactions, whereby sequential and alternating pulses of reactants are used to deposit about one atomic (or molecular) monolayer of material per deposition cycle. The deposition conditions and precursors are typically selected to provide self-saturating reactions, such that an absorbed layer of one reactant leaves a surface termination that is non-reactive with the gas phase reactants of the same reactants. The substrate is subsequently contacted with a different precursor that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example, if some gas phase reactions occur despite the alternating nature of the process.

A cyclical deposition process for depositing an oxide film may comprise two or more sub-cycles, wherein each sub-cycle may comprise an ALD-type process for depositing two or more films, such as, for example, a metal oxide film and a silicon oxide film. In some embodiments, a first sub-cycle may comprise an ALD-type process for depositing a metal oxide film and one deposition cycle, i.e., a unit cycle, may comprise exposing the substrate to a first precursor, removing any unreacted first precursor and reaction byproducts from the reaction chamber, and exposing the substrate to a second precursor, followed by a second removal step. In some embodiments, the first precursor of the first sub-cycle may comprise a metal vapor phase precursor ("the metal precursor") and second precursor of the first sub-cycle may comprise an oxygen precursor ("the oxygen precursor"). In some embodiments, a second sub-cycle may comprise an ALD-type process for depositing a silicon oxide film and one deposition cycle, i.e., a unit cycle, may comprise exposing the substrate first to a first precursor, removing any unreacted first precursor and reaction byproducts from the reaction chamber, and exposing the substrate to a second precursor, followed by a second removal step. In some embodiments, the first precursor of the second sub-cycle may comprise a silicon vapor phase precursor ("the silicon precursor") and the second precursor of the second sub-cycle may comprise a hydrogen peroxide ($H_2O_2$) vapor precursor ("the peroxide precursor").

Precursors may be separated by inert gases, such as argon (Ar) or nitrogen ($N_2$), to prevent gas-phase reactions between precursors and enable self-saturating surface reactions. In some embodiments, however, the substrate may be moved to separately contact a first precursor and a second precursor. Because the reactions self-saturate, strict temperature control of the substrates and precise dosage control of the precursors may not be required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate, before the substrate is contacted with the next reactive chemical. Undesired gaseous molecules can be effectively expelled from a reaction space with the help of an inert purging gas. A vacuum pump may be used to assist in the purging.

Reactors capable of being used to deposit oxide films can be used for the deposition processes described herein. Such reactors include ALD reactors, as well as CVD reactors, configured to provide the precursors. According to some embodiments, a showerhead reactor may be used. According to some embodiments, cross-flow, batch, mini-batch, or spatial ALD reactors may be used.

In some embodiments of the disclosure, a batch reactor may be used. In some embodiments, a vertical batch reactor may be utilized. In other embodiments, the batch reactor comprises a mini-batch reactor configured to accommodate 10 or fewer wafers, 8 or fewer wafers, 6 or fewer wafers, 4 or fewer wafers, or 2 or fewer wafers. In some embodiments in which a batch reactor is used, wafer-to-wafer non-uniformity is less than 3% (1 sigma), less than 2%, less than 1%, or even less than 0.5%.

The deposition processes described herein may optionally be carried out in a reactor or reaction chamber connected to a cluster tool. In a cluster tool, because each reaction chamber is dedicated to one type of process, the temperature of the reaction chamber in each module can be kept constant, which improves the throughput compared to a reactor in which the substrate is heated up to the process temperature before each run. Additionally, in a cluster tool it is possible to reduce the time to pump the reaction chamber to the desired process pressure levels between substrates. In some embodiments of the disclosure, the deposition process may be performed in a cluster tool comprising multiple reaction chambers, wherein each individual reaction chamber may be utilized to expose the substrate to an individual precursor gas and the substrate may be transferred between different reaction chambers for exposure to multiple precursors gases, the transfer of the substrate being performed under a controlled ambient to prevent oxidation/contamination of the substrate. In some embodiments of the disclosure, the deposition process may be performed in a cluster tool comprising multiple reaction chambers, wherein each individual reaction chamber may be configured to perform a different sub-cycle of the overall cyclical deposition process, i.e., the cyclical deposition super-cycle. For example, a first reaction chamber of the cluster tool may be configured to perform a first sub-cycle and a second reaction chamber of the cluster tool may be configured to perform a second sub-cycle, wherein the substrate may be transferred between the first reaction chamber and the second reaction chamber under a controlled environment to prevent unwanted contamination of the substrate and the oxide film thereon.

A stand-alone reactor may be equipped with a load-lock. In that case, it is not necessary to cool down the reaction chamber between each run. In some embodiments, a deposition process for depositing an oxide film, such as a metal oxide film or a silicon oxide film, may comprise a plurality of deposition cycles, i.e., a plurality of unit cycles, for example, ALD cycles or cyclical CVD cycles.

In some embodiments, one or more cyclical deposition processes may be used to deposit the oxide films of the current disclosed on a substrate and the cyclical deposition processes may comprise one or more ALD type process. In some embodiments, a cyclical deposition process may comprise one or more hybrid ALD/CVD or one or more cyclical CVD process. For example, in some embodiments, the growth rate of an ALD process may be low compared with a CVD process. One approach to increase the growth rate may be that of operating at a higher substrate temperature than that typically employed in an ALD process, resulting in at least a portion of the deposition being provided by a chemical vapor deposition type process, but still taking advantage of the sequential introduction of precursors, such a process may be referred to as cyclical CVD.

Figure 2:
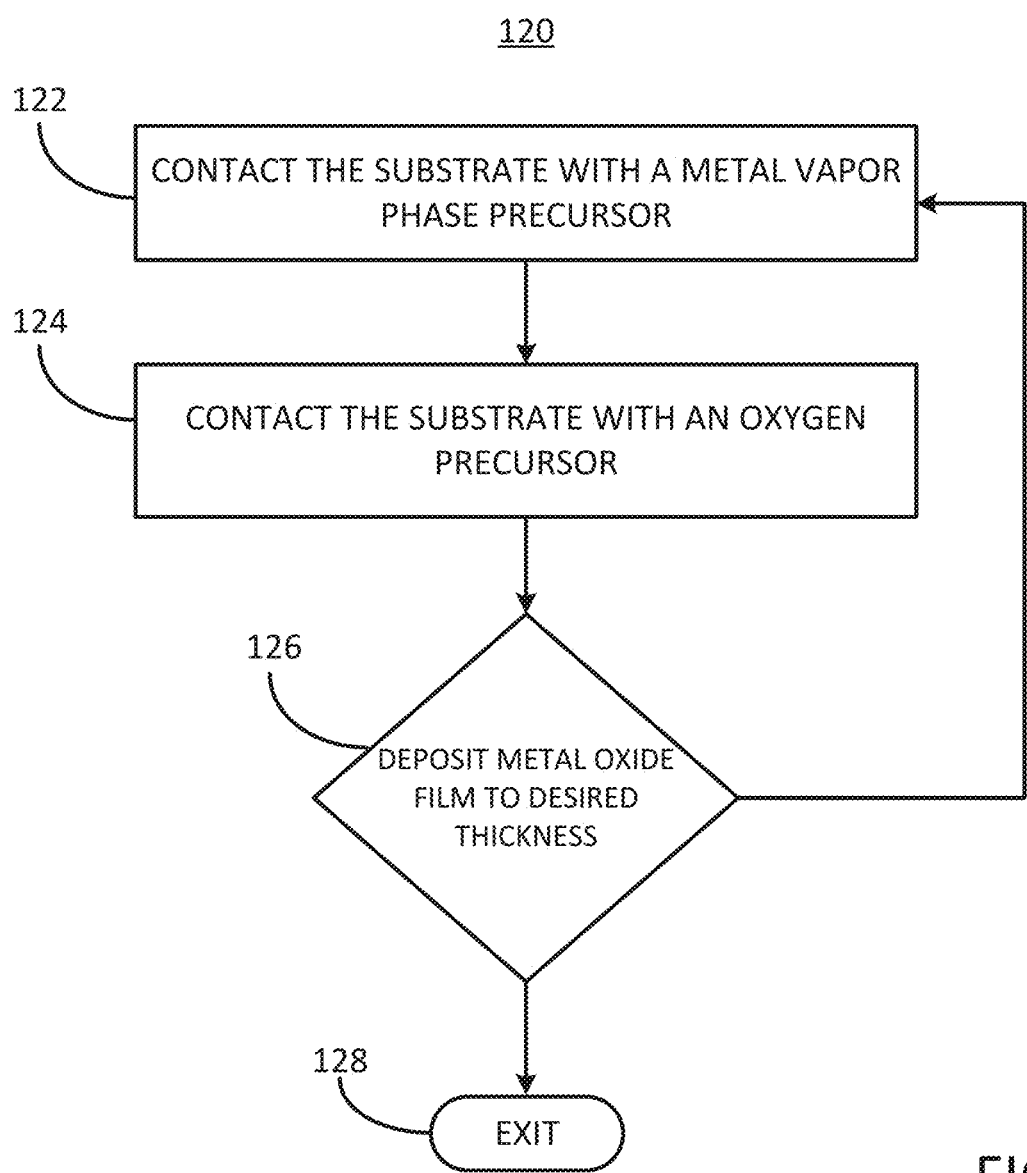
FIG. 2 illustrates a non-limiting exemplary process representing a first sub-cycle of the cyclical deposition processes according to the embodiments of the disclosure.
Figure 3:
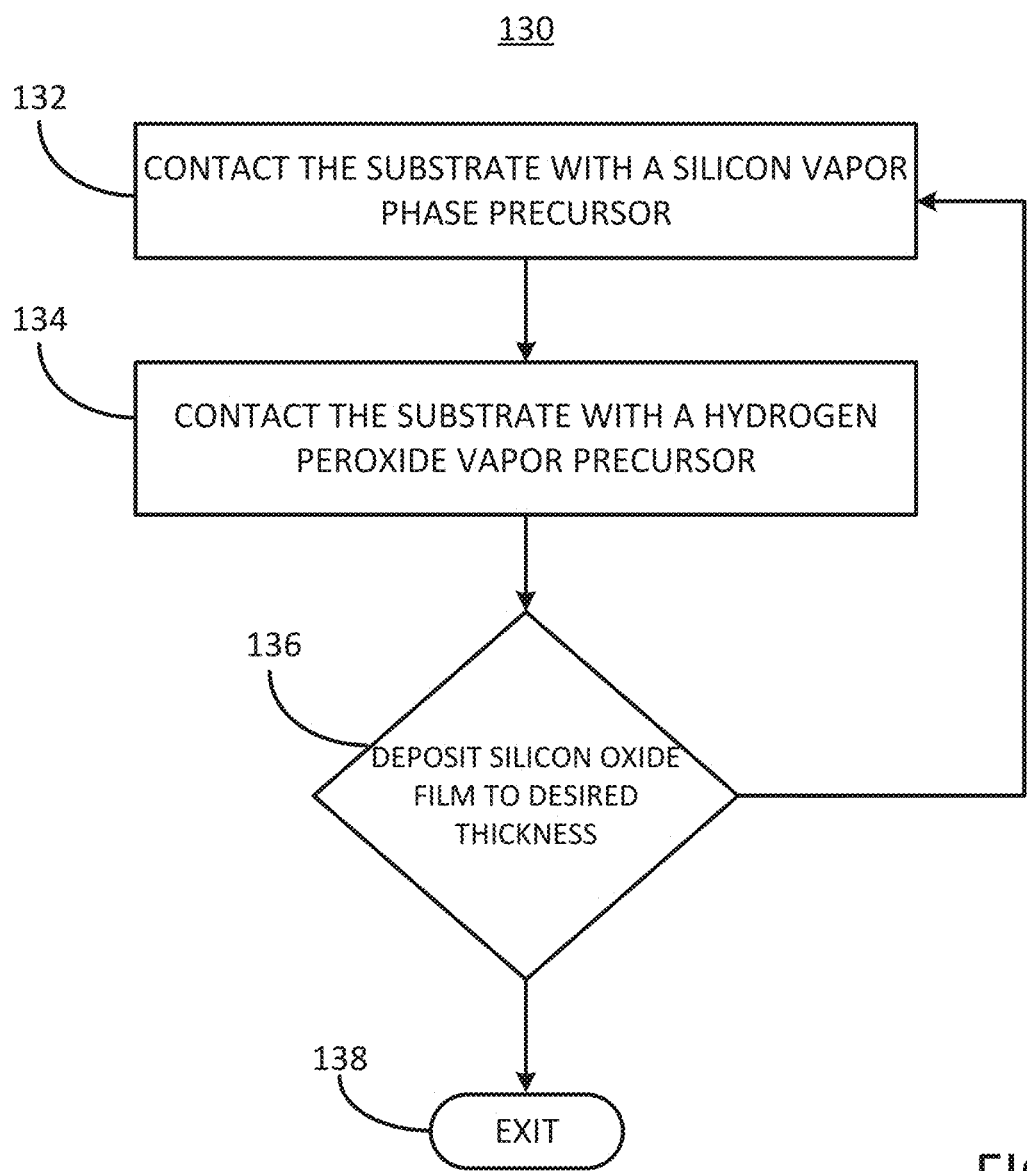
FIG. 3 illustrates a non-limiting exemplary process representing a second sub-cycle of the cyclical deposition processes according to the embodiments of the disclosure.

In some embodiments of the disclosure, a cyclical deposition process may be utilized to deposit an oxide film, such as, for example, an oxide film comprising a metal component and a silicon component, and a non-limiting example of such a cyclical deposition process may be understood with reference to FIGS. 1-3, wherein FIG. 1 illustrates the overall exemplary cyclical deposition process including a cyclical deposition super-cycle, FIG. 2 illustrates an exemplary first sub-cycle for depositing a metal oxide film, and FIG. 3 illustrates an exemplary second sub-cycle for depositing a silicon oxide film.

In more detail, FIG. 1 illustrates an exemplary overall cyclical deposition process 100 including a cyclical deposition super-cycle comprising a first sub-cycle and a second sub-cycle utilized for the deposition of an oxide film. In more detail, exemplary overall cyclical deposition process 100 may commence by means of a process 110 which comprises, providing a substrate into a reaction chamber and heating the substrate to a desired deposition temperature.

In some embodiments of the disclosure, the substrate may comprise a planar substrate or a patterned substrate including high aspect ratio features, such as, for example, trench structures and/or fin structures. The substrate may comprise one or more materials including, but not limited to, silicon (Si), germanium (Ge), germanium tin (GeSn), silicon germanium (SiGe), silicon germanium tin (SiGeSn), silicon carbide (SiC), or a group III-V semiconductor material, such as, for example, gallium arsenide (GaAs), gallium phosphide (GaP), or gallium nitride (GaN). In some embodiments of the disclosure, the substrate may comprise an engineered substrate wherein a surface semiconductor layer is disposed over a bulk support with an intervening buried oxide (BOX) disposed there between.

Patterned substrates may comprise substrates that may include semiconductor device structures formed into or onto a surface of the substrate, for example, a patterned substrate may comprise partially fabricated semiconductor device structures, such as, for example, transistors and/or memory elements. In some embodiments, the substrate may contain monocrystalline surfaces and/or one or more secondary surfaces that may comprise a non-monocrystalline surface, such as a polycrystalline surface and/or an amorphous surface. Monocrystalline surfaces may comprise, for example, one or more of silicon (Si), silicon germanium (SiGe), germanium tin (GeSn), or germanium (Ge). Polycrystalline or amorphous surfaces may include dielectric materials, such as oxides, oxynitrides or nitrides, such as, for example, silicon oxides and silicon nitrides.

The reaction chamber utilized for the deposition may be an atomic layer deposition reaction chamber, or a chemical vapor deposition reaction chamber, or any of the reaction chambers as previously described herein. In some embodiments of the disclosure, the substrate may be heated to a desired deposition temperature during the cyclical deposition process. For example, the substrate may be heated to a substrate temperature of less than approximately 750° C., or less than approximately 650° C., or less than approximately 550° C., or less than approximately 450° C., or less than approximately 350° C., or less than approximately 250° C., or less than approximately 150° C., or even less than 100° C. In some embodiments of the disclosure, the substrate temperature during the cyclical deposition process may be between 100° C. and 750° C., or between 300° C. and 600° C., or between 400° C. and 450° C. In some embodiments of the disclosure, the substrate temperature during the cyclical deposition process may be less than approximately 450° C.

In addition to achieving a desired deposition temperature, i.e., a desired substrate temperature, the deposition process may also regulate the pressure within the reaction chamber during deposition to obtain desirable characteristics of the deposited film. For example, in some embodiments of the disclosure, the deposition process may be performed within a reaction chamber regulated to a reaction chamber pressure of greater than 9 Torr, or greater than 50 Torr, or greater than 75 Torr, or even greater than 100 Torr. In some embodiments, the pressure within the reaction chamber during deposition may be regulated at a pressure between 2 Torr and 300 Torr, or between 30 Torr and 100 Torr.

Upon heating the substrate to a desired deposition temperature, the exemplary cyclical deposition process 100 may continue with a cyclical deposition super-cycle 125 which comprises one or more repetitions of depositing a metal oxide film utilizing at least one deposition cycle of a first sub-cycle and depositing a silicon oxide film utilizing at least one deposition cycle of a second sub-cycle. The cyclical deposition super-cycle 125 may commence by means of a process block 120, which comprises depositing a metal oxide film utilizing at least one deposition cycle of a first sub-cycle.

FIG. 2 illustrates the first sub-cycle 120 in greater detail, wherein the first sub-cycle 120 may commence by means of a process block 122 comprising contacting the substrate with a metal vapor phase precursor. In some embodiments of the disclosure, the metal vapor phase precursor may comprise a transition metal. In some embodiments, the metal vapor phase precursor may comprise a metal selected from the group comprising aluminum (Al), hafnium (Hf), magnesium (Mg), strontium (Sr), yttrium (Y), titanium (Ti), lanthanum (La), erbium (Er), zirconium (Zr), scandium (Sc), cerium (Ce), ytterbium (Yb), and tantalum (Ta). In some embodiments, the metal vapor phase precursor comprises an aluminum vapor phase reactant. In some embodiments, the aluminum vapor phase reactant may comprise at least one of trimethylaluminum (TMA), triethylaluminum (ILA), or dimethylaluminum hydride (DMAH).

In some embodiments, the metal vapor phase reactant may comprise a metal halide vapor phase precursor, such as, for example, a metal chloride vapor phase precursor, a metal iodide vapor phase precursor, or a metal bromide vapor phase precursor. In some embodiment, the metal halide vapor phase precursor may comprise a metal chloride vapor phase precursor, such as, for example, at least one of aluminum trichloride ($AlCl_3$), titanium tetrachloride ($TiCl_4$), hafnium tetrachloride ($HfCl_4$), or tantalum pentachloride ($TaCl_5$).

In some embodiments of the disclosure, the metal vapor phase precursor does not comprise a plasma excited precursor, i.e., the metal oxide film is deposited without plasma excitation of the precursor, in other words the metal oxide film is deposited in a plasma-free environment.

In some embodiments of the disclosure, contacting the substrate with a metal vapor phase precursor may comprise pulsing the metal precursor into the reaction chamber and subsequently contacting the substrate to the metal precursor for a time period of between about 0.01 seconds and about 60 seconds, between about 0.05 seconds and about 10 seconds, or between about 0.1 seconds and about 5.0 seconds. In addition, during the pulsing of the metal precursor, the flow rate of the metal precursor may be less than 2000 sccm, or less than 500 sccm, or even less than 100 sccm. In addition, during the pulsing of the metal precursor over the substrate, the flow rate of the metal precursor may range from about 1 to 2000 sccm, from about 5 to 1000 sccm, or from about 10 to about 500 sccm.

The exemplary sub-cycle 120 of FIG. 2 may continue by purging the reaction chamber. For example, excess metal vapor phase precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess metal vapor phase precursor, such as, for example, excess metal precursors and any possible reaction byproducts may be removed with the aid of a vacuum, generated by a pumping system in fluid communication with the reaction chamber.

Upon purging the reaction chamber with a purge cycle, the exemplary cyclical deposition sub-cycle 120 may continue with a process block 124 comprising, contacting the substrate with an oxygen precursor. In some embodiments the oxygen precursor comprises at least one of water ($H_2O$), hydrogen peroxide ($H_2O_2$), ozone ($O_3$), or oxides of nitrogen, such as, for example, nitrogen monoxide (NO), nitrous oxide ($N_2O$), or nitrogen dioxide ($NO_2$). In some embodiments of the disclosure, the oxygen precursor may comprise an organic alcohol, such as, for example, isopropyl alcohol.

In some embodiments of the disclosure, the oxygen precursor does not comprise a plasma excited precursor, i.e., the metal oxide film is deposited without plasma excitation of the precursor. In other words, the metal oxide film is deposited in a plasma-free environment.

In some embodiments of the disclosure, contacting the substrate with an oxygen precursor may comprise pulsing the oxygen precursor into the reaction chamber and subsequently contacting the substrate to the oxygen precursor for a time period of between about 0.01 seconds and about 60 seconds, between about 0.05 seconds and about 10 seconds, or between about 0.1 seconds and about 5.0 seconds. In addition, during the pulsing of the oxygen precursor, the flow rate of the oxygen precursor may be less than 2000 sccm, or less than 500 sccm, or even less than 100 sccm. In addition, during the pulsing of the oxygen precursor over the substrate, the flow rate of the oxygen precursor may range from about 1 to 2000 sccm, from about 5 to 1000 sccm, or from about 10 to about 500 sccm.

The exemplary sub-cycle 120 of FIG. 2 may continue by purging the reaction chamber. For example, excess oxygen precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess oxygen precursor and any possible reaction byproducts may be removed with the aid of a vacuum, generated by a pumping system in fluid communication with the reaction chamber.

The sub-cycle 120 of FIG. 2 may continue by means of a process block 126 which comprises a decision gate, the decision gate being dependent on the thickness of the metal oxide film to be deposited by the exemplary first sub-cycle 120. If the metal oxide film deposited is at an insufficient thickness for subsequent process steps, then the cyclical sub-cycle 120 may return to the process block 122, and the substrate may be contacted with the metal vapor phase precursor (process block 122) and contacted with the oxygen precursor (process block 124). For example, a single deposition cycle, i.e., a unit cycle, of the first sub-cycle 120 may comprise: contacting the substrate with the metal vapor phase precursor, purging the reaction chamber, contacting the substrate with the oxygen precursor, and purging the reaction chamber again. To deposit a metal oxide film to a desired thickness, the sub-cycle 120 may be repeated one or more times until a desired thickness of a metal oxide film is deposited, at which point the exemplary first sub-cycle may exit via a process block 128.

It should be appreciated that in some embodiments of the disclosure, the order of contacting of the substrate with the metal vapor phase precursor and the oxygen precursor may be such that the substrate is first contacted with the oxygen precursor followed by the metal precursor. In addition, in some embodiments, the cyclical deposition sub-cycle 120 may comprise, contacting the substrate with the metal precursor one or more times prior to contacting the substrate with the oxygen precursor one or more times. In some embodiments, the cyclical deposition sub-cycle 120 may comprise, contacting the substrate with the oxygen precursor one or more times prior to contacting the substrate with the metal precursor one or more times.

In some embodiments of the disclosure, the exemplary cyclical first sub-cycle 120 alternatingly contacts the substrate with a metal precursor and an oxygen precursor and the reaction between the metal precursor and the oxygen precursor may deposit a metal oxide film over a surface of the substrate. In some embodiments of the disclosure, the metal oxide film may comprise at least one of an aluminum oxide, a hafnium oxide, a magnesium oxide, a strontium oxide, an yttrium oxide, a titanium oxide, a lanthanum oxide, an erbium oxide, a zirconium oxide, a scandium oxide, a cerium oxide, an ytterbium oxide, or a tantalum oxide. In particular embodiments, the metal oxide film deposited by the cyclical sub-cycle 120 may comprise an aluminum oxide or a hafnium oxide.

In some embodiments of the disclosure, the exemplary cyclical deposition sub-cycle 120 may not be repeated and only a single unit cycle, i.e., one deposition cycle, of the deposition process may be performed. For example, the substrate may be contacted with the metal precursor and subsequently contacted with the oxygen precursor to deposit a single monolayer, or less than a single monolayer, of the metal oxide film, i.e., in some embodiments the metal oxide film comprises a single monolayer of the metal oxide film. In such embodiments wherein one deposition cycle is utilized for the deposition of the metal oxide film, the metal oxide film may have a thickness of less than 2 Angstroms. In embodiments wherein the metal oxide film is less than 2 Angstroms, the metal oxide may not comprise a continuous film but may rather comprise a plurality of isolated regions of metal oxide disposed over the substrate.

Upon completion of process block 120, i.e., the first sub-cycle, the cyclical deposition super-cycle 125 (FIG. 1) may continue by means of a process block 130 comprising, depositing a silicon oxide film utilizing at least one deposition cycle of a second sub-cycle, in particular the silicon oxide film may be deposited directly on the underlying metal oxide film by means of the second sub-cycle.

FIG. 3 illustrates the second sub-cycle 130 in greater detail, wherein the second sub-cycle 130 may commence by means of a process block 132 comprising contacting the substrate with a silicon vapor phase precursor. In some embodiments of the disclosure, the silicon vapor phase precursor may comprise at least one of an aminosilane, a halide silane, a silicon halide, or a silane. In some embodiments, the silicon vapor phase precursor may comprise at least one of silanediamine N,N,N',N-tetraethyl ($C_8H_{22}N_2Si$), BTBAS (bis(tertiarybutylamino)silane), BDEAS (bis(diethylamino)silane), TDMAS (tris(dimethylamino)silane), hexakis(ethylamino)disilane ($Si_2(NHC_2H_5)_6$), silicon tetraiodide ($SiI_4$), silicon tetrachloride ($SiCl_4$), hexachlorodisilane (HCDS), or pentachlorodisilane(PCDS). In some embodiments, the silicon vapor phase precursor may comprise a silane, such as, for example, silane ($SiH_4$), disilane ($Si_2H_6$), trisilane ($Si_3H_8$), tetrasilane ($Si_4H_{10}$) or higher order silanes with the general empirical formula $Si_xH_{(2x+2)}$.

In some embodiments of the disclosure, the silicon vapor phase precursor does not comprise a plasma excited precursor. In other words, the silicon oxide film is deposited without plasma excitation of the precursor (i.e., the silicon oxide film is deposited in a plasma-free environment).

In some embodiments of the disclosure, contacting the substrate with a silicon vapor phase precursor may comprise pulsing the silicon precursor into the reaction chamber and subsequently contacting the substrate to the silicon precursor for a time period of between about 0.01 seconds and about 60 seconds, between about 0.05 seconds and about 10 seconds, or between about 0.1 seconds and about 5.0 seconds. In addition, during the pulsing of the silicon precursor, the flow rate of the silicon precursor may be less than 2000 sccm, or less than 500 sccm, or even less than 100 sccm. In addition, during the pulsing of the silicon precursor over the substrate, the flow rate of the metal precursor may range from about 1 to 2000 sccm, from about 5 to 1000 sccm, or from about 10 to about 500 sccm.

The exemplary sub-cycle 130 of FIG. 3 may continue by purging the reaction chamber. For example, excess silicon vapor phase precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess silicon vapor phase precursor and any possible reaction byproducts may be removed with the aid of a vacuum, generated by a pumping system in fluid communication with the reaction chamber.

In response to purging the reaction chamber with a purge cycle, the exemplary cyclical deposition sub-cycle 130 may continue with a process block 134 comprising, contacting the substrate with a hydrogen peroxide ($H_2O_2$) vapor precursor.

In some embodiments of the disclosure, the hydrogen peroxide vapor precursor does not comprise a plasma excited precursor, i.e., the silicon oxide film is deposited without plasma excitation of the precursor. In other words, the silicon oxide film is deposited in a plasma-free environment.

In some embodiments of the disclosure, contacting the substrate with a hydrogen peroxide ($H_2O_2$) vapor precursor may comprise pulsing the hydrogen peroxide vapor precursor into the reaction chamber and subsequently contacting the substrate to the hydrogen peroxide vapor precursor for a time period of between about 0.01 seconds and about 60 seconds, between about 0.05 seconds and about 10 seconds, or between about 0.1 seconds and about 5.0 seconds. In addition, during the pulsing of the hydrogen peroxide vapor precursor, the flow rate of the hydrogen peroxide vapor precursor may be less than 2000 sccm, or less than 500 sccm, or even less than 100 sccm. In addition, during the pulsing of the hydrogen peroxide vapor precursor over the substrate, the flow rate of the hydrogen peroxide vapor precursor may range from about 1 to 2000 sccm, from about 5 to 1000 sccm, or from about 10 to about 500 sccm.

The exemplary sub-cycle 130 of FIG. 3 may continue by purging the reaction chamber. For example, excess hydrogen peroxide vapor precursor and reaction byproducts (if any) may be removed from the surface of the substrate, e.g., by pumping with an inert gas. In some embodiments of the disclosure, the purge process may comprise a purge cycle wherein the substrate surface is purged for a time period of less than approximately 5.0 seconds, or less than approximately 3.0 seconds, or even less than approximately 2.0 seconds. Excess hydrogen peroxide vapor phase precursor and any possible reaction byproducts may be removed with the aid of a vacuum, generated by a pumping system in fluid communication with the reaction chamber.

The sub-cycle 130 of FIG. 3 may continue by means of a process block 136 which comprises a decision gate, the decision gate being dependent on the thickness of the silicon oxide film to be deposited by the exemplary second sub-cycle 130. If the silicon oxide film deposited is at an insufficient thickness for subsequent process steps, then the cyclical sub-cycle 130 may return to the process block 132 and the substrate may be contacted with the silicon vapor phase precursor (process block 132) and contacted with the hydrogen peroxide vapor precursor (process block 134). For example, a single deposition cycle, i.e., a unit cycle, of the second sub-cycle 130 may comprise: contacting the substrate with the silicon vapor phase precursor, purging the reaction chamber, contacting the substrate with the hydrogen peroxide vapor precursor, and purging the reaction chamber again. To deposit a silicon oxide film to a desired thickness, the sub-cycle 130 may be repeated one or more times until a desired thickness of a silicon oxide film is deposited directly on the underlying metal oxide film, at which point the exemplary second sub-cycle 130 may exit via a process block 138.

It should be appreciated that in some embodiments of the disclosure, the order of contacting of the substrate with the silicon vapor phase precursor and the hydrogen peroxide vapor precursor may be such that the substrate is first contacted with the hydrogen peroxide vapor precursor followed by the silicon precursor. In addition, in some embodiments, the cyclical deposition second sub-cycle 130 may comprise, contacting the substrate with the silicon precursor one or more times prior to contacting the substrate with the hydrogen peroxide vapor precursor one or more times. In some embodiments, the cyclical deposition second sub-cycle 130 may comprise, contacting the substrate with the hydrogen peroxide vapor precursor one or more times prior to contacting the substrate with the silicon precursor one or more times.

In some embodiments of the disclosure, the exemplary cyclical sub-cycle alternatingly contacts the substrate with a silicon precursor and a hydrogen peroxide vapor precursor and the reaction between the silicon precursor and the hydrogen peroxide vapor precursor may deposit a silicon oxide film directly over the surface of the underlying metal oxide film disposed over the substrate. In some embodiments of the disclosure, the silicon oxide film may comprise silicon dioxide ($SiO_2$) or a silicon suboxide ($SiO_x$) wherein $x<2$.

In some embodiments of the disclosure, the exemplary cyclical deposition sub-cycle 130 may be repeated one or more times until a desired thickness of a silicon oxide film is deposited. Not to be bound by any theory or mechanism, but it is believed that the underlying metal oxide film acts as a catalyst to the growth of the subsequent silicon oxide film and therefore no silicon oxide deposition, or substantially no silicon oxide deposition, may occur without the underlying metal oxide film catalyzing the deposition of the overlying silicon oxide film.

Figure 4:
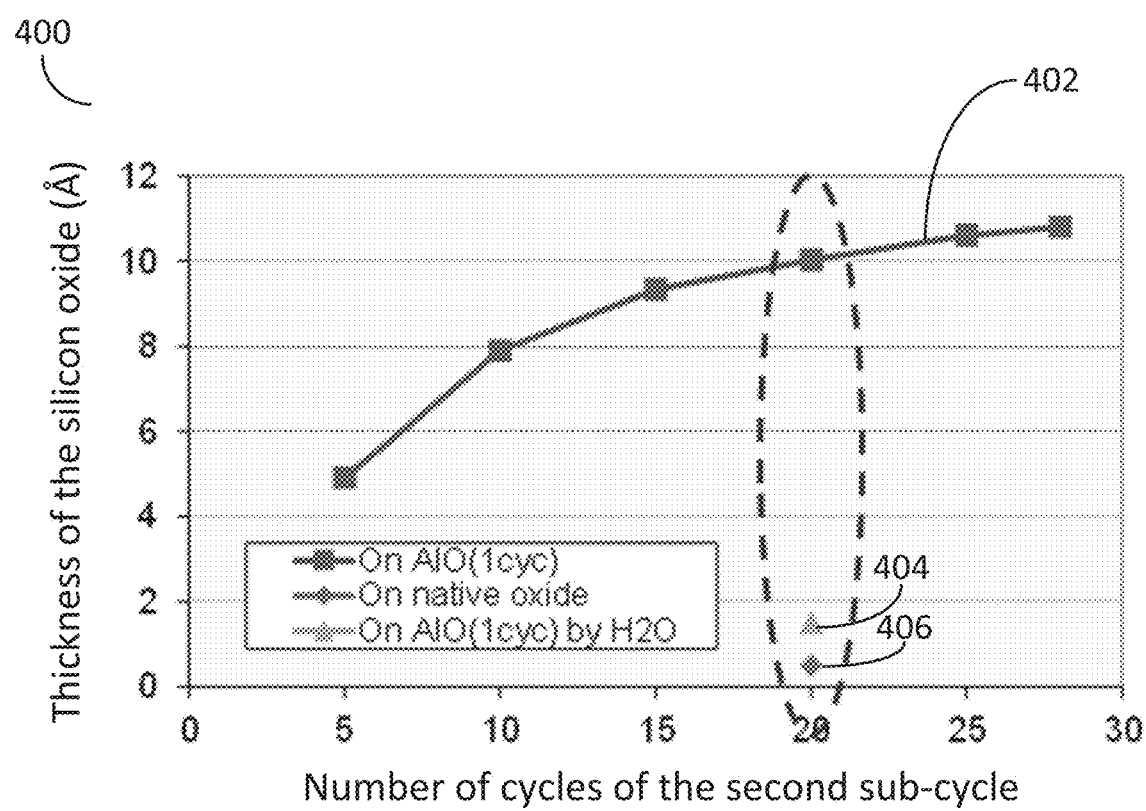
FIG. 4 illustrates a graph showing the deposition rate per cycle for silicon oxides deposited on metal oxide surfaces and native silicon oxide surfaces.

In more detail, FIG. 4 illustrates a graph 400 representing growth rate per deposition cycle of a number of silicon oxide films. The data represented by line 402 indicates the deposition rate per cycle for the second sub-cycle 130 for a silicon oxide deposited on an underlying metal oxide comprising an aluminum oxide, such as, for example, $Al_2O_3$. The data mark indicated by label 404 indicates the total amount of deposition after 20 deposition cycles utilizing water ($H_2O$) vapor instead of a hydrogen peroxide vapor. The data mark indicated by label 406 indicates the total amount of deposition after 20 deposition cycles of the second sub-cycle 130 utilizing a native silicon oxide as the underlying layer directly beneath the deposited silicon oxide. Examination of graph 400 indicates that little to no silicon oxide growth occurs when utilizing water vapor ($H_2O$) instead of a hydrogen peroxide ($H_2O_2$) vapor precursor. In addition, graph 400 indicates that little to no silicon oxide growth occurs utilizing the second sub-cycle 130 when the underlying surface comprises a native silicon oxide. Only silicon oxide deposition occurs when the underlying film comprises a metal oxide, such as, for example, an aluminum oxide, as indicated by the data represented by line 402. Further examination of graph 400 indicates that the growth rate of the silicon oxide decreases with each successive deposition cycle, i.e., as the thickness of the silicon oxide film increases. In other words, in some embodiments, the growth rate of the silicon oxide film decreases with each successive deposition cycle of the second sub-cycle. The growth rate of the silicon oxide on an underlying metal oxide film appears to saturate with increasing thickness. Not to be bound by any theory or mechanism, but it is believed that as the silicon oxide film increases in thickness, the catalytic effect of the underlying metal oxide film diminishes and consequently the growth rate of the silicon oxide film reduces. Therefore, in some embodiments of the disclosure, the second sub-cycle of the cyclical deposition process is performed for less than 50 deposition cycles, or less than 40 deposition cycles, or less than 30 deposition cycles, or less than 20 deposition cycles, or less than 15 deposition cycles, or even less than 10 deposition cycles. In addition, the thickness of the silicon oxide film deposition utilizing the second sub-cycle may be less than 20 Angstroms, 15 Angstroms, or less than 12 Angstroms, or even less than 10 Angstroms.

Upon completion of the second sub-cycle 130, the exemplary cyclical deposition process 100 of FIG. 1 may continue by means of a process block 140 comprising a decision gate, wherein the decision gate is dependent on the total thickness of the oxide film deposited by the first sub-cycle and the second sub-cycle. If the total thickness of the oxide film is insufficient for the desired semiconductor device application, then the cyclical deposition super-cycle 125 may be repeated by returning to the process block 120 and depositing a metal oxide film utilizing at least one deposition cycle of the first sub-cycle and subsequently utilizing the process block 130 to deposit a silicon oxide film utilizing at least one deposition cycle of the second sub-cycle. Therefore, the cyclical deposition super-cycle 125 may be repeated one or more times until a desired thickness of the oxide film is deposited over the substrate. Once the desired thickness of the oxide film is achieved the exemplary cyclical deposition process 100 may exit via a process block 170 and the substrate with the oxide film disposed thereon may be subjected to further semiconductor device fabrication processes.

In some embodiments of the disclosure, the growth rate of the oxide film, e.g., a doped silicon oxide, may be from about 0.005 Å/cycle to about 5 Å/cycle, from about 0.01 Å/cycle to about 2.0 Å/cycle. In some embodiments, the growth rate of the oxide film may be from about 0.1 Å/cycle to about 10 Å/cycle. In some embodiments the growth rate of the oxide film is more than about 0.05 Å/cycle, more than about 0.1 Å/cycle, more than about 0.15 Å/cycle, more than about 0.20 Å/cycle, more than about 0.25 Å/cycle or more than about 0.3 Å/cycle. In some embodiments the growth rate of the oxide film is less than about 2.0 Å/cycle, less than about 1.0 Å/cycle, less than about 0.75 Å/cycle, less than about 0.5 Å/cycle, or less than about 0.2 Å/cycle. In some embodiments of the disclosure, the growth rate of the oxide film is approximately 0.5 Å/cycle.

In some embodiments, the cyclical deposition process for depositing an oxide film having desired characteristics may include one or more cyclical deposition super-cycles, wherein each cyclical deposition super-cycle includes a ratio of a number of first sub-cycles to a number of second sub-cycles, optimized to obtain the desired characteristics of the oxide film. The ratio of the number first sub-cycles to the number of second sub-cycles may comprise 1:50, or 1:30, or 1:25, or 1:20, or 1:15, or 1:10, or 1:5, or 1:2, or 1:1, or lower.

In some embodiments of the disclosure, the oxide film deposited by the cyclical deposition processes described herein may comprise a nanolaminate. For example, the nanolaminate may comprise alternating layers of a metal oxide film, such as, for example, an aluminum oxide, and layers of a silicon oxide, such as, for example, a silicon dioxide.

In some embodiments of the disclosure, the oxide film deposited by the cyclical deposition processes described herein may comprise a doped silicon oxide. For example, the cyclical deposition processes described herein may alternatingly deposit a metal oxide and a silicon oxide film, however since, in some embodiments, the metal oxide film may deposited at a thickness of less than 2 Angstroms, the alternating layers may interdiffuse resulting in a silicon oxide film doped with a metal component, such as, for example, an aluminum doped silicon oxide. Therefore, in some embodiments of the disclosure, the oxide film comprises a doped silicon oxide film. The doped silicon oxide film may be doped with a metal component. In some embodiments, the doped silicon oxide film may be doped with a transition metal. In some embodiments, the doped silicon film may be doped with a the metal selected from the group comprising aluminum (Al), hafnium (Hf), magnesium (Mg), strontium (Sr), yttrium (Y), titanium (Ti), lanthanum (La), erbium (Er), zirconium (Zr), scandium (Sc), cerium (Ce), ytterbium (Yb), and tantalum (Ta). In some embodiments of the disclosure, the doped silicon oxide may comprise an atomic percentage (atomic-%) of metal dopant of less than 10%, or less than 5%, or less than 3%, or less than 2%, or even less than 1%.

The oxide films deposited by the cyclical deposition processes disclosed herein, such as, for example, a doped silicon oxide, may be continuous films. In some embodiments, the oxide film may be continuous at a thickness below approximately 100 nanometers, or below approximately 60 nanometers, or below approximately 50 nanometers, or below approximately 40 nanometers, or below approximately 30 nanometers, or below approximately 20 nanometers, or below approximately 10 nanometers, or below approximately 5 nanometers, or below approximately 2 nanometers, or below approximately 1 nanometer, of even below approximately 0.5 nanometers. The continuity referred to herein can be physical continuity or electrical continuity. In some embodiments of the disclosure, the thickness at which the oxide film may be physically continuous may not be the same as the thickness at which a film is electrically continuous, and vice versa.

In some embodiments of the disclosure, the oxide film deposited according to the cyclical deposition processes described herein, e.g., a nanolaminate or a doped silicon oxide, may have a thickness from about 20 nanometers to about 100 nanometers, or about 20 nanometers to about 60 nanometers. In some embodiments, an oxide film deposited according to some of the embodiments described herein may have a thickness greater than about 20 nanometers, or greater than about 30 nanometers, or greater than about 40 nanometers, or greater than about 50 nanometers, or greater than about 60 nanometers, or greater than about 100 nanometers, or greater than about 250 nanometers, or greater than about 500 nanometers, or greater. In some embodiments an oxide film deposited according to some of the embodiments described herein may have a thickness of less than about 50 nanometers, or less than about 30 nanometers, or less than about 20 nanometers, or less than about 15 nanometers, or less than about 10 nanometers, or less than about 5 nanometers, or less than about 3 nanometers, or less than about 2 nanometers, or even less than about 1 nanometer.

In the embodiments disclosed herein, a cyclical deposition process is utilized to deposit an oxide film. In some embodiments, the oxide film is deposited in a plasma-free environment, i.e., the oxide is deposited without plasma excitation of any precursors. Therefore, the embodiments of the disclosure may deposit oxide films, such as metal oxide/silicon oxide nanolaminates or doped silicon oxides, which have superior characteristics to oxide films deposited by plasma-enhanced deposition processes. For example, the oxide films deposited by the cyclical deposition processes of the disclosure may have a density of greater than 2.2 g/cm$^3$, or greater than 2.3 g/cm$^3$, or even greater than 2.4 g/cm$^3$. In some embodiments, the oxide film may comprise an aluminum doped silicon oxide film deposited in a plasma-free environment with a density greater than 2.2 g/cm$^3$.

In some embodiments, the oxide films deposited according the cyclical deposition processes disclosed herein may have superior etch resistance to comparable oxide films deposited by plasma-enhanced deposition processes. For example, the ratio of a wet etch rate of the oxide films deposited by the cyclical deposition processes of the disclosure to a wet etch rate of thermal silicon oxide (WERR) in dilute hydrofluoric acid (1:100) may be less than 3.0, or less than 2.5, or less than 2.0, or less than 1.8, or less than 1.6, or less than 1.5, or even less than 1.4. In some embodiments, the oxide film may comprise an aluminum doped silicon oxide film deposited in a plasma free environment with a wet etch rate ratio (WERR) of the aluminum doped silicon oxide film to a wet etch rate of thermal oxide in dilute hydrofluoric acid (1:100) being less than 1.5.

In some embodiments of the disclosure, the oxide films deposited according to the cyclical deposition processes disclosed herein may have a refractive index (at a wavelength of 633 nanometers) of greater than approximately 1.460, or greater than approximately 1.470, or greater than 1.480, or even greater than approximately 1.490. For example, the oxide film may comprise an aluminum silicon oxide film with a refractive index (at a wavelength of 633 nanometers) of approximately 1.460.

In some embodiments of the disclosure, the oxide film may be deposited on a substrate comprising high aspect ratio features, e.g., a three-dimensional, non-planar substrate. In some embodiments, the oxide film may be deposited over a substrate which comprises one or more trench structures and/or fin structures with an aspect ratio (height/width) of greater than 10:1, or greater than 20:1, or greater than 30:1, or even greater than 50:1. In such embodiments, wherein the oxide film is deposited over a substrate comprising high aspect ratio features, the step coverage may be greater than approximately 90%, or greater than approximately 95%, or greater than approximately 99%, or even substantially equal to 100%.

Figure 5A:
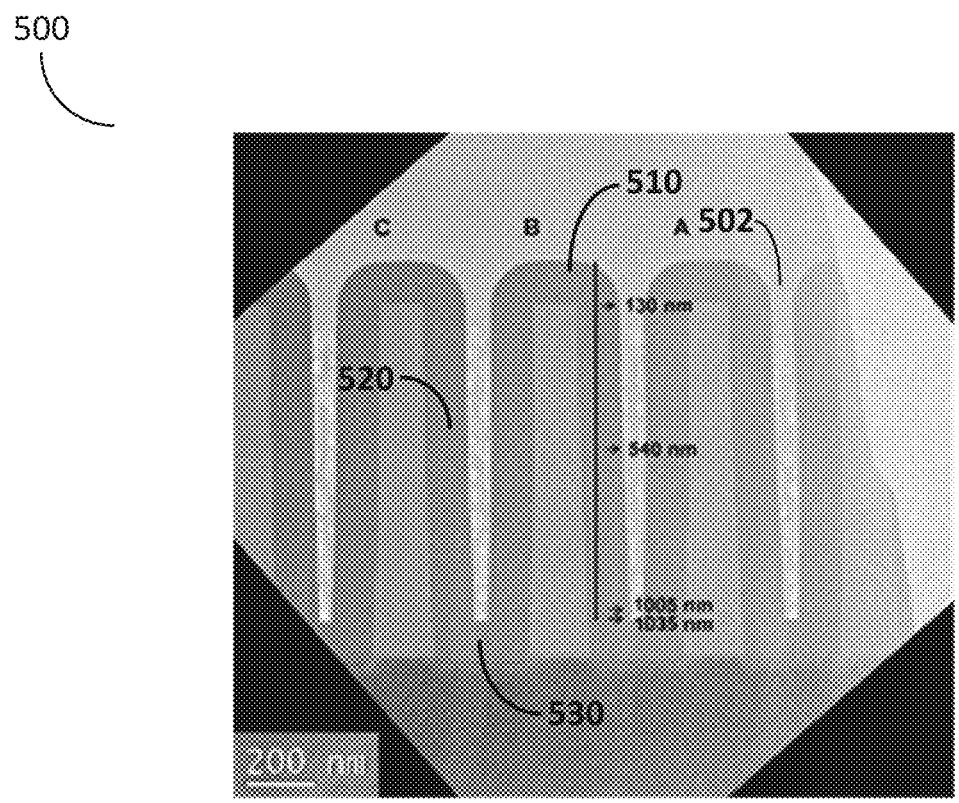
FIGS. 5A, 5B, 5C and 5D illustrate transmission electron microscope (TEM) images of semiconductor structures including high aspect ratio trenches with an oxide film disposed thereon deposited according to the embodiments of the disclosure.
Figure 5B:
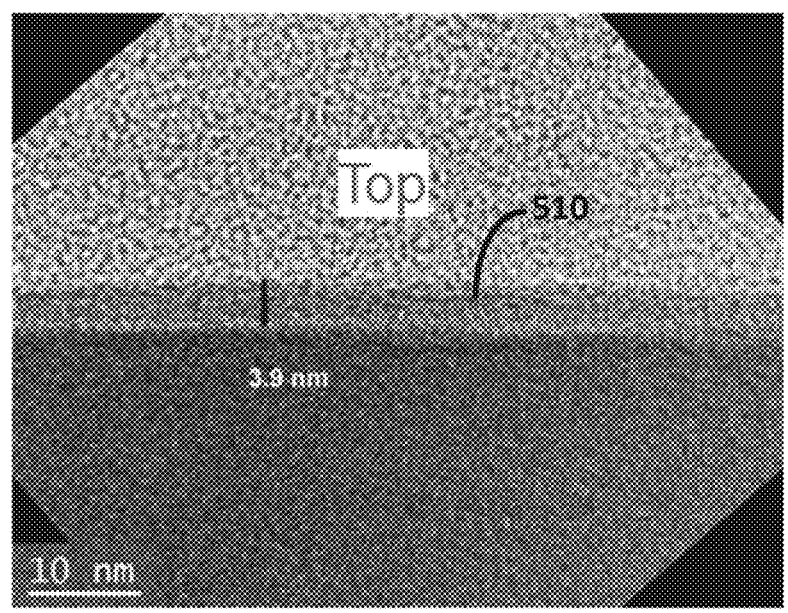
Figure 5C:
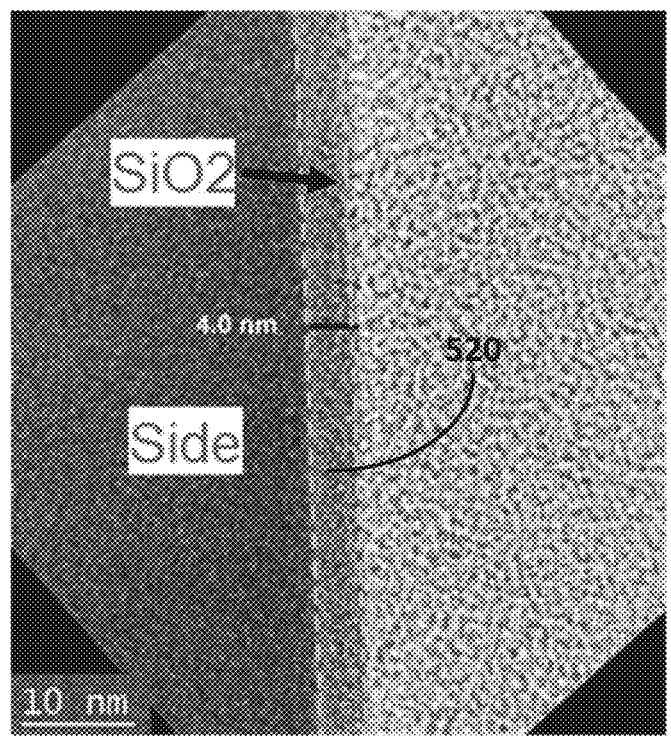
Figure 5D:
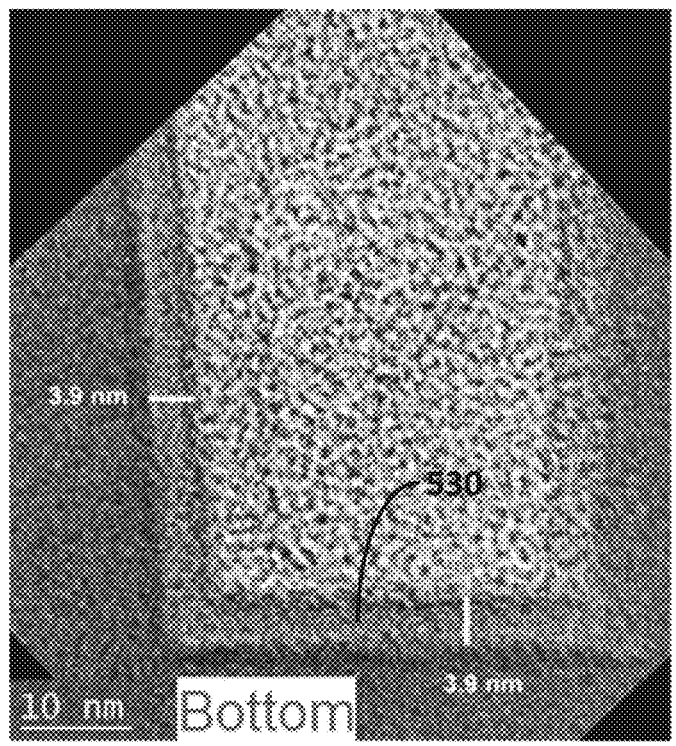

FIGS. 5A-5D illustrate transmission electron microscope (TEM) images of semiconductor structures including high aspect ratio trench structures with an oxide film deposited thereon according to the embodiments of the disclosure. FIG. 5A illustrates a TEM image of semiconductor structure 500 including a number of high aspect ratio trench structures 502 having an aspect ratio (height/width) of 10:1. An oxide film is disposed over the trench structures 502, in this non-limiting example the oxide film comprises an approximately 4 nanometer thick aluminum doped silicon oxide and comprises lateral portions 510 and 530, 510 being disposed over a top surface and 530 being disposed over a bottom surface, and sidewall portions 520 being disposed over the sidewalls of the trench structures 502. FIG. 5B illustrates a high magnification TEM image showing a lateral portion of the oxide film 510 disposed over a top surface of one of the trench structures, the oxide film having a film thickness of 3.9 nanometers. FIG. 5C illustrates a high magnification TEM image showing a sidewall portion of the oxide film 520 disposed over a sidewall of one of the trench structures, the oxide film having a film thickness of 4.0 nanometers. FIG. 5D illustrates a high magnification TEM image showing a lateral portion of the oxide film 530 disposed over a bottom surface of one of the trench structures, the oxide film having a film thickness of 3.9 nanometers. In this non-limiting example embodiment, the step coverage of the oxide film, i.e., the aluminum doped silicon oxide film, is calculated as the percentage of the bottom oxide thickness divided by the top oxide thickness, i.e., 100%×3.9 nm/3.9 nm, which equals a step coverage of 100% for the oxide film over a high aspect ratio of 10:1.

As previously described herein, plasma-enhanced atomic layer deposition (PEALD) of oxide films may result in oxide films with anisotropic properties resulting from the directionality of the excited oxygen species utilized in the deposition process. For example, when oxide films, such as, for example, silicon oxide films, are deposited by PEALD processes over high aspect ratio features, the lateral portions of the oxide film and the sidewall portions of the oxide film may have significantly different etch rates, resulting from the poorer quality of the sidewall portions of the oxide film compared with the lateral portions of the oxide film. In contrast, the oxide films, such as, for example, oxide nanolaminates and doped silicon oxides of the current disclosure may have substantially equivalent oxide qualities for both the sidewall portions of the oxide film and the lateral portions of the oxide film. Therefore, in some embodiments of the disclosure, the oxide films deposited by the cyclical deposition processes disclosed herein may be deposited over one or more trench and/or fin structures, and the oxide film may comprise a sidewall portion and a lateral portion wherein the wet etch rate ratio (WERR) of the sidewall portion and the lateral portion are substantially equal.

Figure 6:
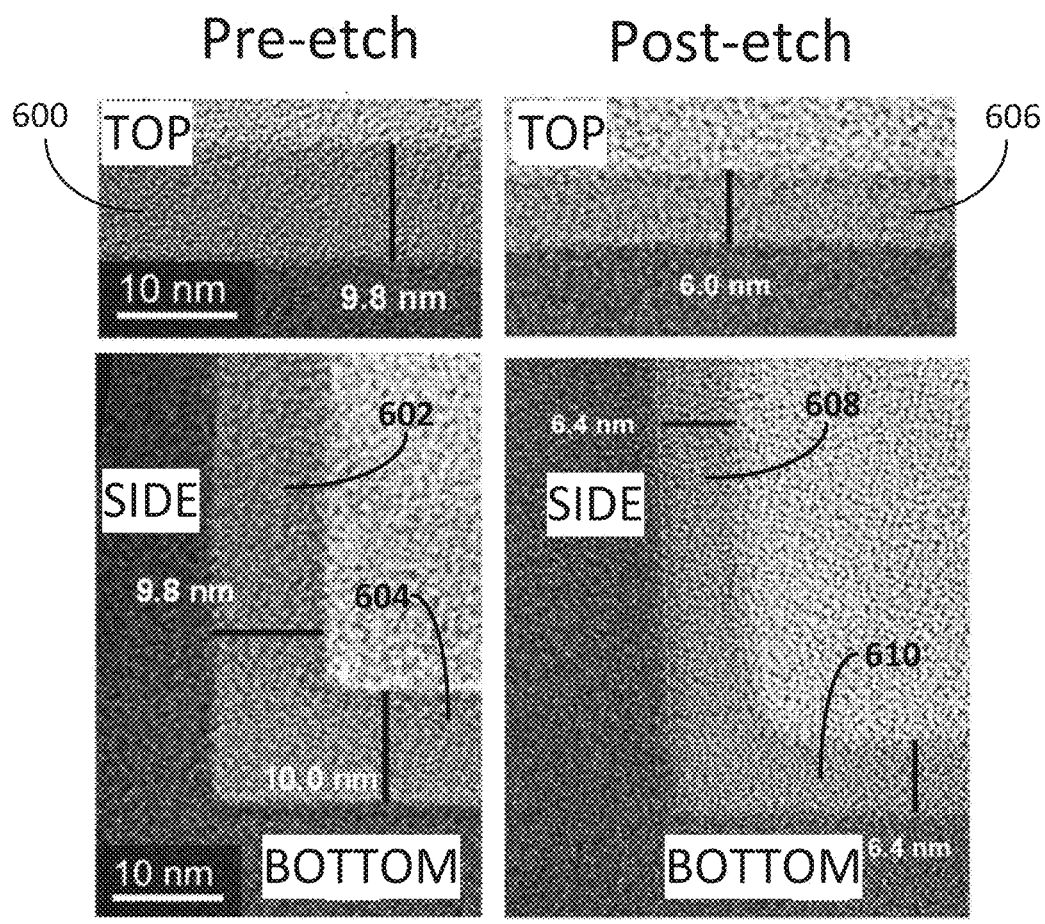
FIG. 6 illustrates transmission electron microscope (TEM) images of a semiconductor structure including high aspect ratio trenches with an oxide film disposed thereon before and after an etch process.

As a non-limiting example, FIG. 6 illustrates transmission electron microscope (TEM) images of a semiconductor structures including high aspect ratio trenches with an oxide film disposed thereon pre-etch and post-etch. In more detail, an aluminum doped silicon oxide was deposited over a high aspect ratio trench structure with an aspect ratio of approximately 10:1. The doped aluminum oxide (pre-etch) disposed on a top surface of the trench 600 has a thickness of approximately 9.8 nanometers, whereas the doped aluminum oxide (pre-etch) disposed on a sidewall of the trench 602 has a thickness of approximately 9.8 nanometers, and the doped aluminum oxide (pre-etch) disposed on a bottom surface of the trench 604 has a thickness of approximately 10 nanometers. The trench structure with the aluminum doped silicon oxide was wet etched in dilute hydrofluoric acid (100:1) for a time period of 45 seconds. Post-etch, the doped aluminum oxide disposed on the top surface of the trench 606 has a thickness of approximately 6.0 nanometers corresponding to a wet etch rate ratio of approximately 1.66. Post-etch, the doped aluminum oxide disposed on the sidewall surface of the trench 608 has a thickness of approximately 6.4 nanometers corresponding to a wet etch rate ratio of approximately 1.61. Post-etch, the doped aluminum oxide disposed on the bottom surface of the trench 610 has a thickness of approximately 6.4 nanometers corresponding to a wet etch rate ratio of approximately 1.54. Therefore, as illustrated by FIG. 6, the wet etch rate ratio of a sidewall portion and a lateral portion of a silicon oxide deposited by the embodiments of the disclosure are substantially equal, wherein substantially equal may refer to a percentage difference between the wet etch ratio of the sidewall portion and the wet etch ratio of the lateral portion of less than 10%.

Figure 10:
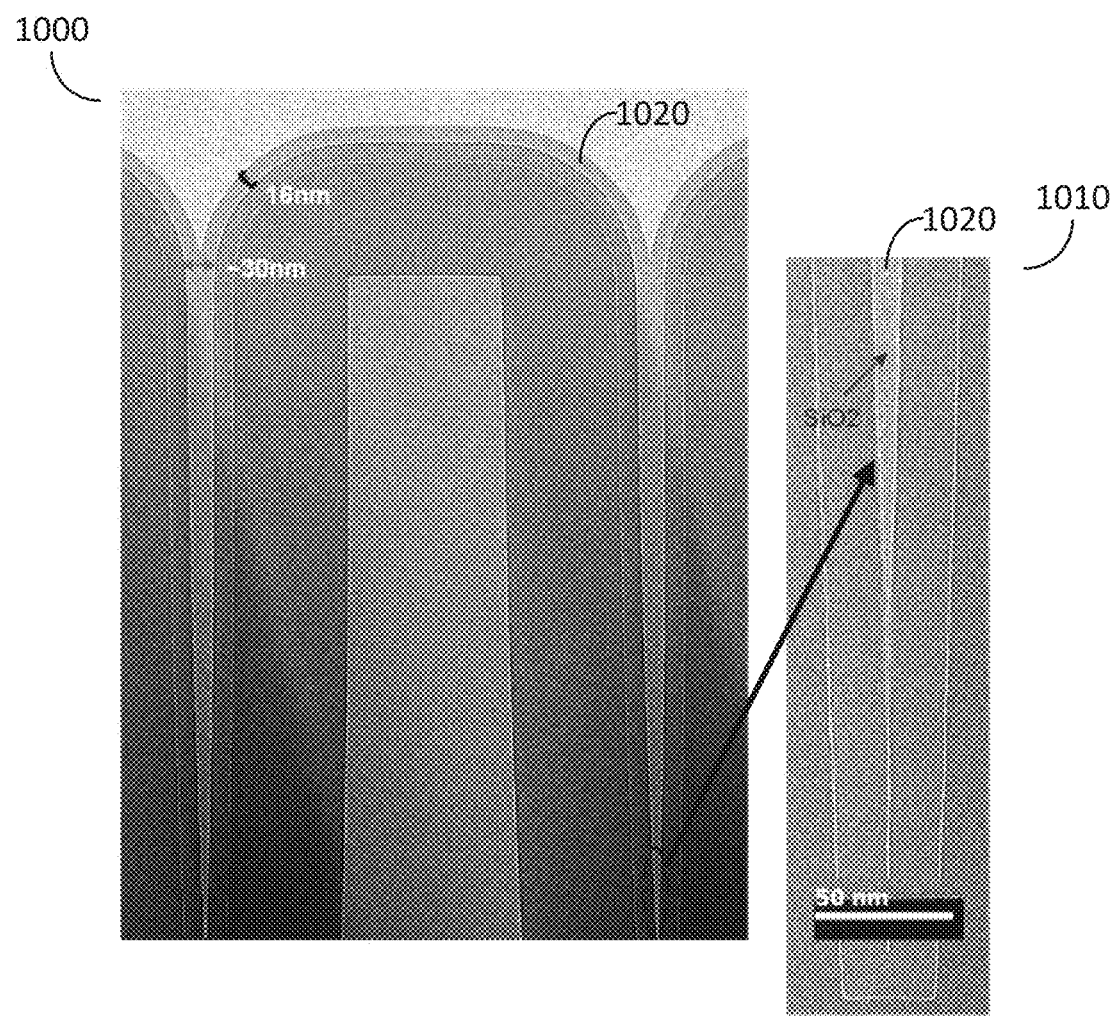
FIG. 10 illustrates a transmission electron microscopy (TEM) image of a semiconductor structure 1000 including vertical high aspect ratio features filled with an oxide film formed according to the embodiments of the disclosure.

In some embodiments of the disclosure, the oxide films formed as disclosed herein may be utilized as gap-fill materials. As a non-limiting example, the oxide film may comprise a silicon dioxide film and may be formed within vertical high aspect ratio gap features without the formation of a seam. For example, FIG. 10 illustrates a transmission electron microscopy (TEM) image of a semiconductor structure 1000 including vertical high aspect ratio features with a depth of approximately 1000 nanometers and a width of approximately 30 nanometers, i.e., vertical gap features with an aspect ratio of approximately 33. Disposed within the vertical high aspect ratio features is a silicon dioxide film 1020 formed according to the embodiments of the current disclosure. Semiconductor structure 1010 illustrates a high magnification TEM image of the base of the vertical gap feature which demonstrated that the silicon dioxide film 1020 fills the vertical gap feature without the formation of a seam, wherein a seam may refer to a line or one or more voids formed by the abutment of edges formed in a gap fill material, and the seam can be confirmed by transmission electron microscopy (TEM), where if observations reveal a clear vertical line or one or more vertical void in the gap fill material, a seam is present.

In some embodiments of the disclosure, the oxide film comprises a doped silicon oxide, wherein the doped silicon oxide contains a silicon content of greater than 28 atomic %, or greater than 30 atomic %, or greater than 32 atomic %, or even greater than 34 atomic %. In some embodiments of the disclosure, the oxide film comprises a doped silicon oxide, wherein the doped silicon oxide contains an oxygen content of greater than 62 atomic %, or greater than 64 atomic %, or even greater than 66 atomic %. In some embodiments of the disclosure, the oxide film comprises a doped silicon oxide, wherein the doped silicon oxide contains a nitrogen content of less than 2 atomic %, or less than 1 atomic %, or even less than 0.5 atomic %. In some embodiments of the disclosure, the oxide film comprises a doped silicon oxide, wherein the doped silicon oxide contains a carbon content of less than 2 atomic %, or less than 1 atomic %, or even less than 0.5 atomic %. In some embodiments of the disclosure, the oxide film comprises a doped silicon oxide, wherein the doped silicon oxide contains a metal dopant content of less than 5 atomic %, or less than 2 atomic %, or less than 1 atomic %, or even less than 0.5 atomic %. In some embodiments, the metal dopant comprises aluminum and the aluminum doped silicon oxide contains an aluminum content of less than 5 atomic %, or less than 2 atomic %, or less than 1 atomic %, or even less than 0.5 atomic %.

In some embodiments of the disclosure, the oxide films deposited by the methods disclosed herein may be subjected to one or more post deposition processes to further improve the quality of the oxide films, e.g., to reduce impurity concentration and/or densify the oxide film. For example, the oxide film may go through a post deposition thermal process wherein the oxide film is heated to a temperature of less than 900° C., or less than 800° C., or less than 700° C., or even less than 600° C. The post deposition thermal processes performed on the oxide films may be implemented in a reaction chamber under a controlled atmosphere, wherein the atmosphere may comprise forming gas (10% hydrogen in nitrogen), or an ozone/oxygen ($O_3/O_2$) mixture, or an oxygen based plasma.

The oxide films, e.g., metal oxide/silicon oxide nanolaminates or doped silicon oxides, deposited by the cyclical deposition processes disclosed herein may be utilized in a variety of semiconductor device applications. For example, the oxide films of the present disclosure may be utilized as a gate dielectric in a transistor structure, or a liner material in a shallow trench isolation (STI) structure, or as an interface layer to a multitude of semiconductor device structures.

Figure 7:
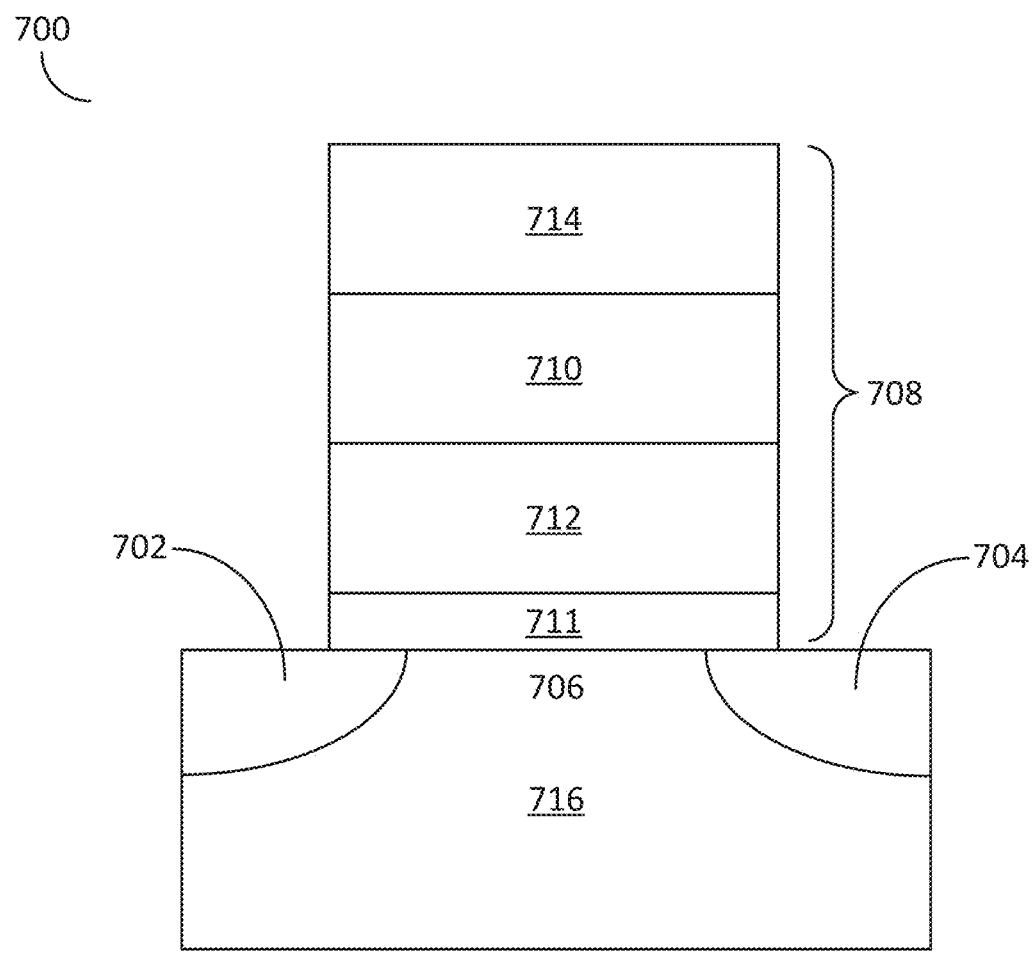
FIG. 7 illustrates a cross-sectional view of a semiconductor device structure including an oxide film deposited according to the embodiments of the disclosure.

As a non-limiting example embodiment, the oxide film may comprise an aluminum doped silicon oxide utilized as an interface layer in a semiconductor transistor application, such as a planar transistor structure or a multiple gate transistor (e.g., FinFET). In more detail, and with reference to FIG. 7, a semiconductor device structure 700 may comprise a semiconductor body 716 and a gate electrode 710 comprising, for example, titanium aluminum carbide, disposed over the semiconductor body 716. In some embodiments, the semiconductor device structure 700 may comprise a transistor structure and may also include a source region 702, a drain region 704, and a channel region 706 disposed therebetween. A transistor gate structure 708 may comprise an electrode, i.e., a gate electrode 710, which may be separated from the channel region 706 by a gate dielectric 712 (e.g., a high-k material) and an interface layer 711, the interface layer 711 being disposed directly on the channel region 706 between the channel region 706 and the gate dielectric 712. According to the present disclosure, the interface layer 711 may comprise an oxide film deposited according to the embodiments of the disclosure and may comprise a metal oxide/silicon oxide nanolaminate or a doped silicon oxide, such as, for example, aluminum doped silicon oxide. The gate electrode 710 may comprise a metal, a metal nitride, or a metal carbide film, such as, a titanium aluminum carbide (TiAlC), for example. As shown in FIG. 7, in some embodiments, the transistor gate structure 708 may further comprise one or more additional conductive layers 714 formed on the gate electrode 710. The one or more additional conductive layers 714 may comprise at least one of a polysilicon, a refractory metal, a transition metal carbide, or a transition metal nitride.

Figure 8:
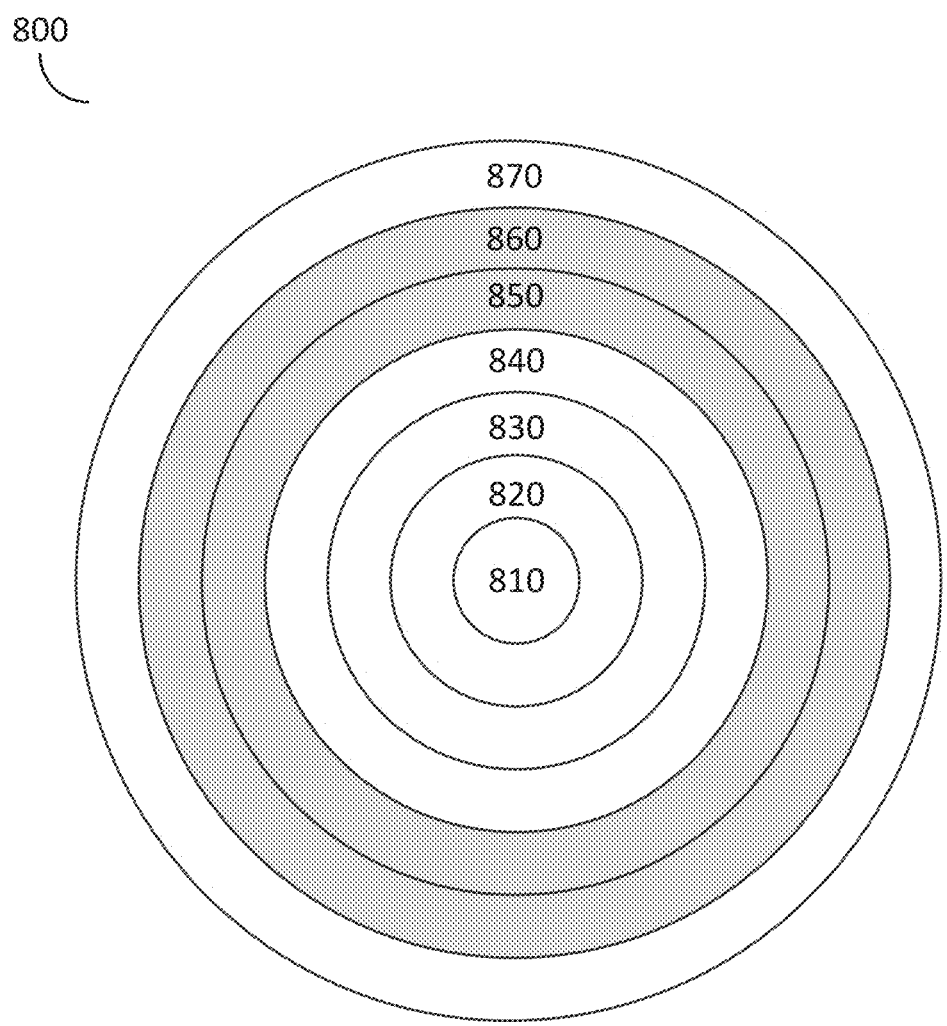
FIG. 8 illustrates a top cross-sectional view of an additional semiconductor device structure including an oxide film deposited according to the embodiments of the disclosure.

As a further non-limiting example embodiment, the oxide films deposited according to the embodiments of the disclosure may be utilized as a blocking oxide in a vertical NAND (VNAND) semiconductor device structure. In more detail, FIG. 8 illustrates a top cross sectional view of an exemplary VNAND semiconductor device structure 800. The VNAND semiconductor device structure 800 may comprise an oxide core or hole 810, a channel 820, a tunnel oxide 830, a charge trapping layer 840, a first blocking oxide 850, a second blocking oxide 860, and a control gate 870. In some embodiments of the disclosure, the first blocking oxide 850 and the second blocking oxide 860 may comprises a metal oxide/silicon oxide nanolaminate or a doped silicon oxide deposited according to the embodiments of the disclosure. For example, the first blocking oxide 850 and the second blocking oxide 860 may comprise an aluminum doped silicon oxide deposited according to the embodiments of the disclosure.

Figure 9:
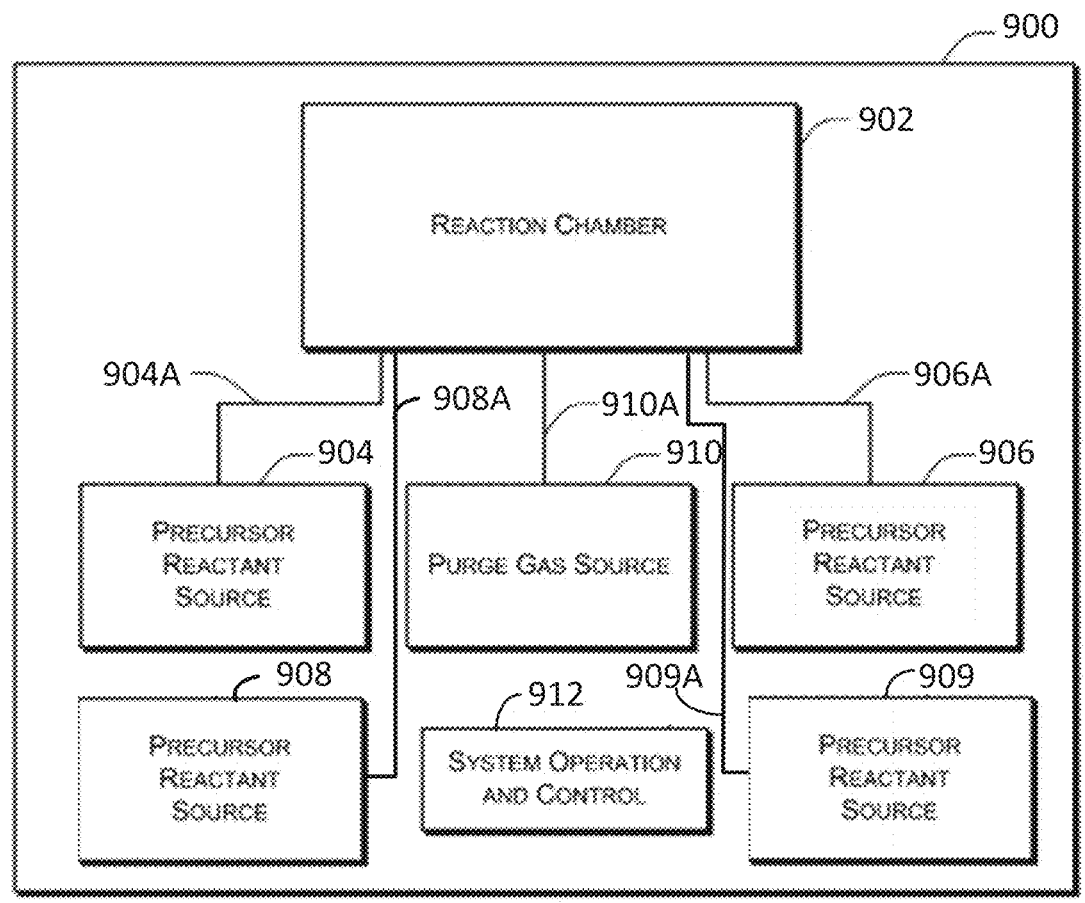
FIG. 9 illustrates a reaction system configured to perform the cyclical deposition processes according to the embodiments of the disclosure.

Embodiments of the disclosure may also include a reaction system configured for forming the oxide films of the present disclosure. In more detail, FIG. 9 schematically illustrates a reaction system 900 including a reaction chamber 902 that further includes mechanism for retaining a substrate (not shown) under predetermined pressure, temperature, and ambient conditions, and for selectively exposing the substrate to various gases. A precursor reactant source 904 may be coupled by conduits or other appropriate means 904A to the reaction chamber 902, and may further couple to a manifold, valve control system, mass flow control system, or mechanism to control a gaseous precursor originating from the precursor reactant source 904. A precursor (not shown) supplied by the precursor reactant source 904, the reactant (not shown), may be liquid or solid under room temperature and standard atmospheric pressure conditions. Such a precursor may be vaporized within a reactant source vacuum vessel, which may be maintained at or above a vaporizing temperature within a precursor source chamber. In such embodiments, the vaporized precursor may be transported with a carrier gas (e.g., an inactive or inert gas) and then fed into the reaction chamber 902 through conduit 904A. In other embodiments, the precursor may be a vapor under standard conditions. In such embodiments, the precursor does not need to be vaporized and may not require a carrier gas. For example, in one embodiment the precursor may be stored in a gas cylinder. The reaction system 900 may also include additional precursor reactant sources, such as precursor reactant source 906, which may also be coupled to the reaction chamber by conduits 906A as described above. The reaction system may include additional precursor reactant source 908, which may also be coupled to the reaction chamber by conduits 908A, as described above. The reaction system may also include further additional precursor reactant source 909, which may also be coupled to the reaction chamber by conduits 909A, as described above. In some embodiments of the disclosure, precursor reactant source 904 may comprise a metal vapor phase precursor, precursor reactant source 906 may comprise an oxygen precursor, precursor reactant source 908 may comprise a silicon vapor phase precursor, and precursor reactant source 909 may comprise a hydrogen peroxide ($H_2O_2$) vapor precursor. Therefore, in some embodiments of the disclosure, the exemplary cyclical deposition process 100 (FIG. 1) may be performed in a single reaction chamber.

A purge gas source 910 may also be coupled to the reaction chamber 902 via conduits 910A, and selectively supplies various inert or noble gases to the reaction chamber 902 to assist with the removal of precursor gas or waste gases from the reaction chamber. The various inert or noble gases that may be supplied may originate from a solid, liquid or stored gaseous form.

The reaction system 900 of FIG. 9 may also comprise a system operation and control mechanism 912 that provides electronic circuitry and mechanical components to selectively operate valves, manifolds, pumps and other equipment included in the reaction system 900. Such circuitry and components operate to introduce precursors, purge gases from the respective precursor sources 904, 906, 908, 909, and purge gas source 910. The system operation and control mechanism 912 also controls timing of gas pulse sequences, temperature of the substrate and reaction chamber, and pressure of the reaction chamber and various other operations necessary to provide proper operation of the reaction system 900. The operation and control mechanism 912 can include control software and electrically or pneumatically controlled valves to control flow of precursors, reactants, and purge gases into and out of the reaction chamber 902. The control system can include modules such as a software or hardware component, e.g., a FPGA or ASIC, which performs certain tasks. A module can advantageously be configured to reside on the addressable storage medium of the control system and be configured to execute one or more processes.

Those of skill in the relevant arts appreciate that other configurations of the present reaction system are possible, including a different number and kind of precursor reactant sources and purge gas sources. Further, such persons will also appreciate that there are many arrangements of valves, conduits, precursor sources, purge gas sources that may be used to accomplish the goal of selectively feeding gases into reaction chamber 902. Further, as a schematic representation of a reaction system, many components have been omitted for simplicity of illustration, and such components may include, for example, various valves, manifolds, purifiers, heaters, containers, vents, and/or bypasses.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

What is claimed is:

1. A semiconductor device structure, comprising:
a substrate comprising a trench structure having a height-to-width aspect ratio of greater than 10:1; and
an oxide film disposed on the substrate and within the trench structure comprising:
a metal oxide layer formed within the trench structure; and
a silicon oxide layer formed overlying and in contact with the metal oxide layer, the silicon oxide layer formed using hydrogen peroxide,
wherein the oxide film has a step coverage of greater than 90% within the trench structure.

2. The semiconductor device structure of claim 1, wherein the metal oxide layer and the silicon oxide layer are interdiffused, such that the oxide film comprises an aluminum-doped silicon oxide.

3. The semiconductor device structure of claim 2, wherein the oxide film comprises less than ten atomic percentage aluminum.

4. The semiconductor device structure of claim 2, wherein the oxide film comprises greater than 28 atomic percent silicon.

5. The semiconductor device structure of claim 2, wherein the oxide film comprises greater than 62 atomic percent oxygen.

6. The semiconductor device structure of claim 2, wherein the oxide film comprises at least one of:
less than two atomic percent nitrogen, or
less than two atomic percent carbon.

7. The semiconductor device structure of claim 1, wherein the oxide film has a density of greater than 2.2 g/cm$^3$.

8. The semiconductor device structure of claim 1, wherein the oxide film has a wet etch rate ratio of less than 3.0 in dilute hydrofluoric acid (1:100).

9. The semiconductor device structure of claim 1, wherein the oxide film has a refractive index at a wavelength of 633 nanometers of greater than approximately 1.460.

10. The semiconductor device structure of claim 1, wherein the silicon oxide film is disposed directly on the metal oxide film.

11. A semiconductor device structure, comprising:
a semiconductor body comprising a trench structure having a height-to-width aspect ratio of greater than 10:1;
an interface layer disposed on the semiconductor body comprising an oxide film, wherein the oxide film comprises:
a metal oxide layer formed within the trench structure; and
a silicon oxide layer formed overlying and in contact with the metal oxide layer,
wherein the oxide film has a step coverage of greater than 90% within the trench structure; and
a gate electrode comprising at least one of a metal, a metal nitride, or a metal carbide disposed on the interface layer.

12. The semiconductor device structure of claim 11, wherein the gate electrode comprises titanium aluminum carbide.

13. The semiconductor device structure of claim 11, wherein the semiconductor body comprises a channel region, wherein the interface layer is disposed on the channel region.

14. The semiconductor device structure of claim 11, wherein the metal oxide layer and the silicon oxide layer are interdiffused, wherein the oxide film comprises an aluminum-doped silicon oxide.

15. The semiconductor device structure of claim 14, wherein the oxide film comprises less than ten atomic percentage aluminum.

16. The semiconductor device structure of claim 14, wherein the oxide film comprises greater than 62 atomic percent oxygen.

17. The semiconductor device structure of claim 14, wherein the oxide film comprises greater than 28 atomic percent silicon.

18. A semiconductor device structure formed by the steps of:
depositing a metal oxide film on a substrate utilizing at least one deposition cycle of a first sub-cycle of a cyclical deposition process, wherein the cyclical deposition process comprises the first sub-cycle and a second sub-cycle,
wherein the at least one deposition cycle of the first sub-cycle comprises:
contacting the substrate with a metal vapor phase precursor; and
contacting the substrate with an oxygen precursor comprising at least one of hydrogen peroxide ($H_2O_2$), nitrogen monoxide (NO), nitrous oxide ($N_2O$), nitrogen dioxide ($NO_2$), and an organic alcohol; and
depositing a silicon oxide film on the metal oxide film utilizing at least one deposition cycle of the second sub-cycle of the cyclical deposition process,
wherein the at least one deposition cycle of the second sub-cycle comprises:
contacting the substrate with a silicon vapor phase precursor; and
contacting the substrate with a hydrogen peroxide ($H_2O_2$) vapor precursor, and
wherein an oxide film is formed using the step of depositing the metal oxide film and the step of depositing the silicon oxide film on the metal oxide film.

19. The semiconductor device structure of claim 18, wherein the metal vapor phase reactant comprises at least one of triethylaluminum (TEA) or dimethylaluminum hydride (DMAH).

20. The semiconductor device structure of claim 18, wherein the silicon oxide film is disposed directly on the metal oxide film.

* * * * *